United States Patent
Komagata

(10) Patent No.: US 7,135,409 B2
(45) Date of Patent: Nov. 14, 2006

(54) PLASMA ETCHING METHOD FOR SEMICONDUCTOR DEVICE

(75) Inventor: Shogo Komagata, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 30 days.

(21) Appl. No.: 10/892,135

(22) Filed: Jul. 16, 2004

(65) Prior Publication Data

US 2005/0048790 A1 Mar. 3, 2005

(30) Foreign Application Priority Data

Aug. 29, 2003 (JP) ............... 2003-305944

(51) Int. Cl.
*H01L 21/302* (2006.01)
(52) U.S. Cl. ............... 438/706; 438/714; 438/725
(58) Field of Classification Search ........... 438/706, 438/710, 712, 714, 723, 724, 725
See application file for complete search history.

(56) References Cited

U.S. PATENT DOCUMENTS 5,167,762 A * 12/1992 Carr et al. ............... 438/714
5,409,562 A * 4/1995 Kumihashi et al. ........... 216/59
5,565,036 A * 10/1996 Westendorp et al. .. 118/723 MP
5,789,867 A * 8/1998 Westendorp et al. .... 315/111.21
5,804,088 A * 9/1998 McKee .................. 216/47
6,465,964 B1 * 10/2002 Taguchi et al. ......... 315/111.21
6,499,424 B1   12/2002 Kazumi et al.
2002/0052113 A1 * 5/2002 Khan et al. ............... 438/689
2005/0009215 A1 * 1/2005 Goto et al. ................. 438/8
2005/0098536 A1 * 5/2005 Choi et al. ................. 216/67

FOREIGN PATENT DOCUMENTS

| JP | 62-179119 | * | 8/1987 |
| JP | 06-349776 | | 12/1994 |
| JP | 09-237777 | | 9/1997 |
| JP | 2002-231608 | | 8/2002 |

* cited by examiner

*Primary Examiner*—Kin-Chan Chen
(74) *Attorney, Agent, or Firm*—Rabin & Berdo, PC

(57) ABSTRACT

The present invention relates to plasma etching in which $O_2$ gas is added with He gas as a main component. At an early stage of a plasma discharge, $Cl_2$ gas is added and thereafter the supply of the $Cl_2$ gas is stopped. A small amount of $Cl_2$ gas is added in advance before the discharge start and thereafter the discharge is started.

8 Claims, No Drawings

PLASMA ETCHING METHOD FOR SEMICONDUCTOR DEVICE

BACKGROUND OF THE INVENTION

1. Field of the Invention

The present invention relates to a plasma etching technology suitable for use in manufacturing a semiconductor device, and particularly to a method for stably starting a discharge upon plasma etching using helium (He) gas.

2. Description of the Related Art

With an improvement in performance of a semiconductor integrated circuit and high integration thereof, a plasma etching technology is required to provide a high accuracy dimension and high etching selectivity for an underlying film. The dimensions of a gate electrode of a MOS transistor at micro-fabrication become important factors for determining a threshold voltage of an elemental device. Gate electrode dimensions of 0.1 μm-level have been required together with miniaturization. Although the current leading-edge semiconductor exposure is one using ArF scanner light, an exposure system is expensive, the life of an optical lens is short and running costs are high. Therefore, developments have been put forward in the direction to further reduce critical dimensions at KrF scanner exposure which has heretofore been used.

However, a practical minimum pattern size is about 0.16 μm at the KrF scanner exposure. It is difficult to form a fine pattern of 0.1 μm level under the present circumstances. As a method for overcoming the above exposure problem, there is known a method for reducing dimensions by etching rather than reducing exposure dimensions. As a general method, may be mentioned, for example, a slimming technique for anisotropically etching a resist mask by means of a mixed gas of helium (He) and oxygen ($O_2$) to thereby reduce or scale down it.

The plasma etching technology using the mixed gas features that no reactivity occurs in many insulating materials such as silicon nitride (SiN), silicon oxide ($SiO_2$), etc. used in a semiconductor process in general and even in conductive materials such as polysilicon (poly-Si), tungsten silicide (WSi), titanium nitride (TiN), etc., and hence no etching is effected thereon. Therefore, this gas is most suitable as an etching gas for slimming a resist and generally used in the slimming technique.

However, plasma etching in which $O_2$ gas is added with He gas as a principal component, involves a problem that a discharge is hard to take place in an etching chamber. The electron disposition of He atoms makes a closed shell and first ionization energy is maximum like 24.5 eV in all atoms. Therefore, the ignition of a low-voltage glow discharge using He gas is hard to take place. It was thus difficult to stably start the discharge.

SUMMARY OF THE INVENTION

The present invention has been made to solve the above-described problems and aims to add chlorine ($Cl_2$) gas at an early stage of a discharge upon plasma etching in which $O_2$ gas is added with He gas as a principal component. After a small amount of $Cl_2$ gas has been added in advance before the discharge, the discharge is started.

According to the present invention, since the $Cl_2$ gas is added at the early stage of the discharge upon the plasma etching in which the $O_2$ gas is added with the He gas as the principal component, an ignition characteristic is improved upon the discharge and the start of a stable discharge is enabled. Since the discharge is started after the small amount of $Cl_2$ gas has been added in advance before the start of the discharge, the start of the stable discharge can be realized.

DETAILED DESCRIPTION OF THE INVENTION

In the first embodiment of the present invention, $Cl_2$ gas is added in addition to He/$O_2$ at an early stage of a discharge start. Etching conditions are that when, for example, an ICP (Inductively Coupled Plasma) etching system is used, the discharge is started under a pressure of 0.04 Pa, a $Cl_2$/$O_2$/He flow rate=5/20/60 sccm, a high-frequency power=250 W and a low-frequency power=0 W. Since the stable discharge is reached after 2 to 3 seconds have elapsed since the discharge start, an ignition step per se is sufficiently possible within 5 seconds. Thereafter, while the supply of the $Cl_2$ gas is stopped and the discharge is being maintained, etching is continuously carried out by the He/$O_2$ gas under conditions of a pressure of 0.04 Pa, a $Cl_2$/$O_2$/He flow rate=5/20/60 sccm, a high-frequency power=250 W and a low-frequency power=100 W.

According to the first embodiment as described above, the addition of the $Cl_2$ gas as an ignition gas makes it possible to easily start the discharge upon execution of the discharge with He/$O_2$ gas. A subsequent He/$O_2$ discharge can stably be carried out. Although the $Cl_2$ gas is added in the present embodiment, the ignition is enabled similarly even in the case of addition of $CF_4$, $CH_3$, $CH_2F_2$, $SF_6$, HBr, or the like.

A second embodiment will next be described. In the second embodiment, ignition gas is added in advance before a discharge, whereas upon the start of the discharge, the supply of the ignition gas is stopped and the discharge is caused to continue. That is, $Cl_2$ gas is applied into a chamber in addition to an He/$O_2$ mixed gas before the startup of the discharge. For example, the flow rate of the $Cl_2$ gas is set to 5 sccm, and the discharge is carried out after stabilization of the flow rate of the $Cl_2$ gas under conditions of a pressure of 0.04 Pa and a $Cl_2$/$O_2$/He flow rate=5/20/60 sccm as etching conditions in the ICP etching system. However, the supply of the $Cl_2$ gas is stopped at the start of the discharge. In succession to it, the discharge is started under conditions of a pressure of 0.04 Pa, an $O_2$/He flow rate=20/60 sccm, a high-frequency power=250 W and a low-frequency power=80 W. Since the $Cl_2$ gas has already been added prior to the start of the discharge in this case, the discharge becomes easy to start owing to residual $Cl_2$.

According to the second embodiment as described above, since the $Cl_2$ gas is added before the discharge of the He/$O_2$ gas, igniting becomes easy owing to the $Cl_2$ residual gas. Since no gas is caused to flow during the actual discharge, the influence of contamination or the like on a semiconductor wafer by additive gases can also be suppressed to the minimum. While the $Cl_2$ gas is used as the igniting additive gas, the ignition is made possible similarly even in the case of addition of $CF_4$, $CHF_3$, $CH_2F_2$, $SF_6$, HBr, etc.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method for plasma etching a semiconductor device, comprising:

continuously supplying an etching gas composed principally of a helium gas;

initiating a discharge start;

at an early stage of the discharge start, adding a discharge ignition gas to the etching gas;

stopping a supply of the discharge ignition gas; and after the supply of the discharge ignition gas is stopped, plasma etching the semiconductor device using the etching gas.

2. A method according to claim 1, wherein the discharge ignition gas is selected from the group consisting of $Cl_2$, $CF_4$, $CHF_3$, $CH_2F_2$, $SF_6$ and HBr.

3. A method according to claim 2, wherein the etching gas is a mixed gas of helium and oxygen.

4. A method according to claim 2, wherein said plasma etching is effected on a resist film formed in the semiconductor device.

5. A method for plasma etching a semiconductor device, comprising:

continuously supplying an etching gas composed principally of a helium gas;

adding a discharge ignition gas to the etching gas;

after the discharge ignition gas is added to the etching gas, initiating a discharge start;

upon commencing the discharge start, stopping a supply of the discharge ignition gas; and after the supply of the discharge ignition gas is stopped, plasma etching the semiconductor device using the etching gas.

6. A method according to claim 5, wherein the discharge ignition gas is selected from the group consisting of $Cl_2$, $CF_4$, $CHF_3$, $CH_2F_2$, $SF_6$ and HBr.

7. A method according to claim 6, wherein the etching gas is a mixed gas of helium and oxygen.

8. A method according to claim 6, wherein said plasma etching is effected on a resist film formed in the semiconductor device.

* * * * *